(12) United States Patent
Kroeker

(10) Patent No.: US 6,719,516 B2
(45) Date of Patent: *Apr. 13, 2004

(54) SINGLE WAFER LOAD LOCK WITH INTERNAL WAFER TRANSPORT

(75) Inventor: Tony Kroeker, Georgetown, TX (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/161,970

(22) Filed: Sep. 28, 1998

(65) Prior Publication Data

US 2002/0031420 A1 Mar. 14, 2002

(51) Int. Cl.[7] ............................................. B65G 49/07
(52) U.S. Cl. ................. 414/217; 414/744.6; 414/939
(58) Field of Search ........................ 414/226.05, 935, 414/937, 941, 939, 217, 416, 744.6, 749.1, 222.12, 226.03; 118/719; 204/298.25

(56) References Cited

U.S. PATENT DOCUMENTS

| | | | |
|---|---|---|---|
| 4,618,309 A | 10/1986 | Gregg et al. | 414/753 |
| 4,797,054 A | 1/1989 | Arii | 414/217 |
| 4,923,054 A * | 5/1990 | Ohtani et al. | 414/941 X |
| 5,080,549 A * | 1/1992 | Goodwin et al. | 414/939 X |
| 5,100,502 A | 3/1992 | Murdoch et al. | 156/643 |
| 5,186,718 A | 2/1993 | Tepman et al. | 29/25.01 |
| 5,226,632 A | 7/1993 | Tepman et al. | 251/335.3 |
| 5,288,379 A * | 2/1994 | Namiki et al. | 414/217 X |
| 5,292,393 A | 3/1994 | Maydan et al. | 156/345 |
| 5,330,301 A * | 7/1994 | Brancher | 414/940 X |
| 5,447,409 A * | 9/1995 | Grunes et al. | 414/939 X |

(List continued on next page.)

FOREIGN PATENT DOCUMENTS

| | | | |
|---|---|---|---|
| EP | 0 556 865 A1 | 8/1993 | |
| JP | 62142320 | 6/1987 | |
| JP | 405106039 | * 4/1993 | 414/939 |
| WO | WO 87/07078 | 11/1987 | |

OTHER PUBLICATIONS

U.S. Patent Application Entitled "Single wafer Load Lock Chamber for Pre–Processing and Post–Processing Wafers in a Vacuum Processing System," Ser. No. 08/990,396, filed Dec. 15, 1997.
PCT Search Report dated Jul. 7, 2000.

*Primary Examiner*—James W. Keenan
(74) *Attorney, Agent, or Firm*—Moser Patterson & Sheridan

(57) ABSTRACT

The present invention provides a load lock having a vertically movable lid, an internal robot, and a wafer lifting mechanism and further provides a method of transferring wafers through a load lock directly to a process chamber. An atmospheric transfer robot shuttles wafers to and from the lifting mechanism while the lid is raised and the lifting mechanism then transfers wafers to and from the internal robot. The load lock is directly attached to a process chamber and communicates therewith via a slit valve which is selectively opened and closed. The internal robot is extended and retracted through the slit valve aperture in order to transfer a wafer to and from the process chamber. In one embodiment the lifting mechanism is comprised of vertically movable lift pins disposed through the bottom of the load lock. In another embodiment the lifting mechanism includes two pairs of lift forks disposed through the cover of the load lock. Each pair of forks is capable of independent rotational and vertical movement and each pair is adapted to handle a single wafer.

18 Claims, 18 Drawing Sheets

U.S. PATENT DOCUMENTS

| | | | |
|---|---|---|---|
| 5,558,482 A | | 9/1996 | Hiroki et al. ................ 414/217 |
| 5,558,487 A | | 9/1996 | Nakagawa ................ 414/744.6 |
| 5,607,276 A | * | 3/1997 | Muka et al. ............. 414/940 X |
| 5,769,952 A | * | 6/1998 | Komino ................... 414/217 X |
| 5,830,272 A | * | 11/1998 | Begin et al. ............. 414/217 X |
| 5,879,128 A | * | 3/1999 | Tietz et al. .............. 414/939 X |
| 5,934,856 A | * | 8/1999 | Asakawa et al. ........ 414/939 X |
| 5,947,677 A | * | 9/1999 | Matsushima et al. ... 414/940 X |
| 5,997,235 A | * | 12/1999 | Hofmeister ............. 414/939 X |
| 6,186,722 B1 | * | 2/2001 | Shirai ..................... 414/939 X |
| 6,224,312 B1 | * | 5/2001 | Sundar ................... 414/939 X |

* cited by examiner

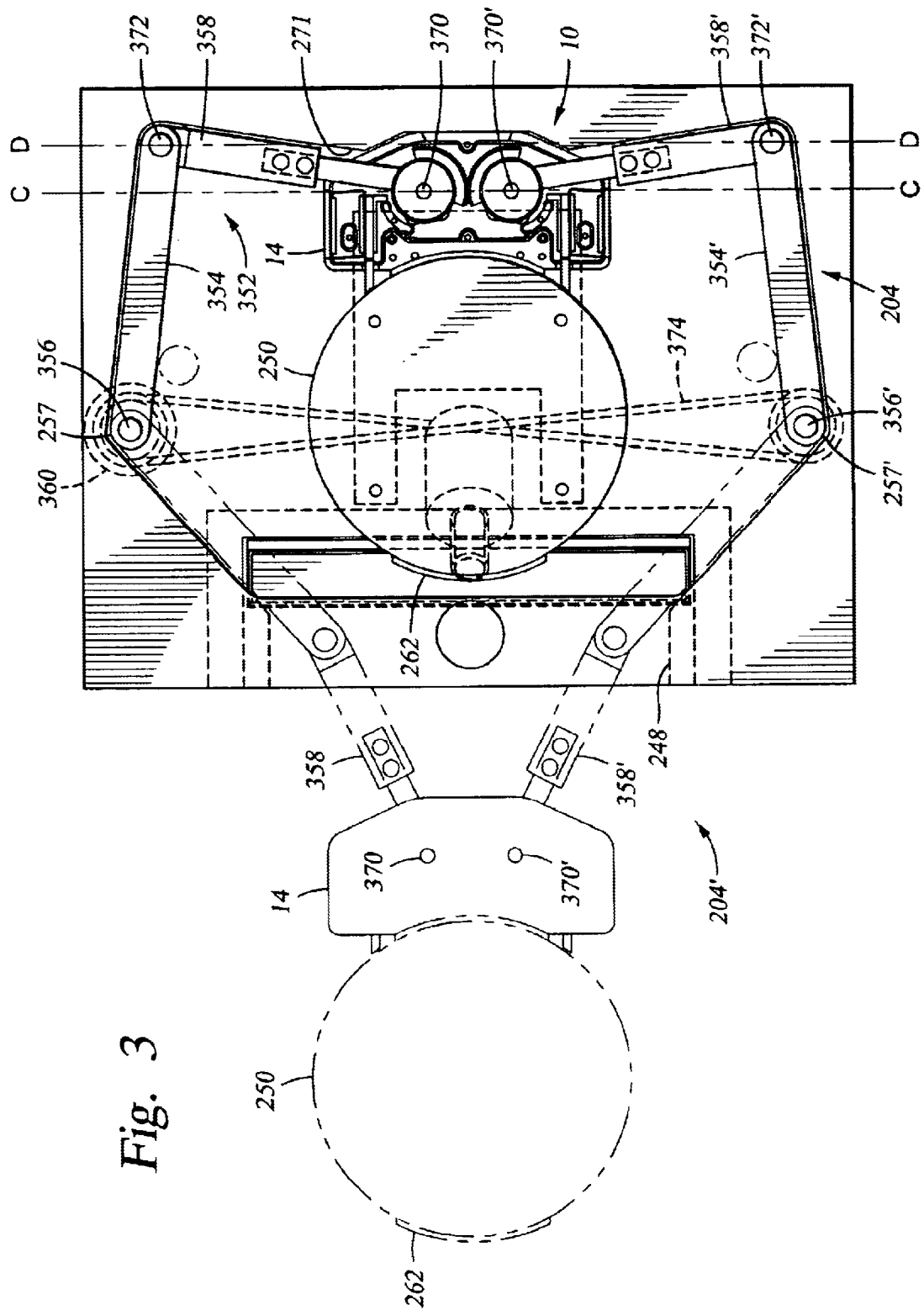

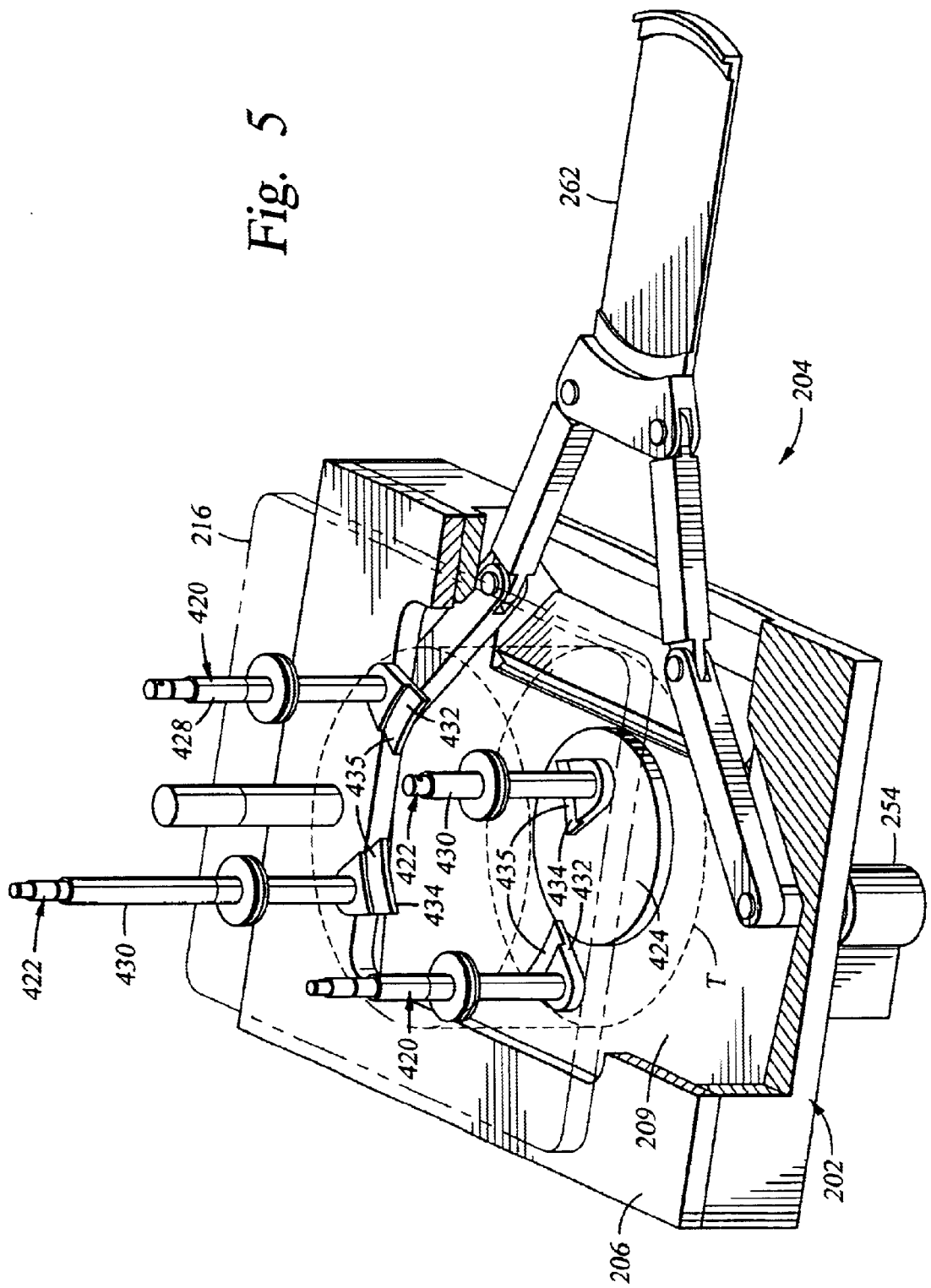

SINGLE WAFER LOAD LOCK WITH INTERNAL WAFER TRANSPORT

BACKGROUND OF THE INVENTION

1. Field of the Invention

The present invention relates to a load lock apparatus and method for transferring wafers between a wafer source and a processing chamber. Specifically, the present invention relates to a single or multi-wafer load lock attached directly to a process chamber in a vacuum processing system.

2. Background of Related Art

The use of cluster tools in semiconductor wafer processing is well known. Examples include the CENTURA® and ENDURA® platforms available from Applied Materials, Inc., located in Santa Clara, Calif. An example of a typical cluster tool 100 is shown in FIG. 1. Cluster tools generally include mounting a plurality of process chambers 104 to a transfer chamber 102. The transfer chamber 102 houses a centrally located robot 120 which communicates with the process chambers 104 through slit valves (not shown). Current practice includes the use of load locks 108 as intermediary chambers between pod loaders 115–118, a mini-environment 114, and the transfer chamber 102. The load lock 108 is continuously alternated between ambient pressure when communicating with pod loaders 115–118 and a vacuumed condition when communicating with the transfer chamber 102.

In operation, wafers 122 are transported from the load lock 108 into the transfer chamber 102 by the transfer chamber robot 120. Once the load lock 108 is hermetically sealed from the transfer chamber 102, a slit valve (not shown) is opened providing access between the transfer chamber 102 and a process chamber 104. The wafer 122 is transferred into the process chamber 104 where the wafer undergoes any number of processes including physical vapor deposition, chemical vapor deposition, etching, etc. During wafer transfer out of or into one load lock chamber 108, the other load lock chamber 108 can be vented to atmosphere and communicate with the pod loaders 115–118 to receive additional wafers and/or dispose of processed wafers. Cluster tools typically include two load locks to allow simultaneous communication with ambient conditions by one load lock and with vacuum conditions by the other, thereby increasing the number of wafers which can be processed by the tool. This is typically referred to as the throughput of the tool.

Efforts to achieve greater throughput are a driving force behind design changes to semiconductor manufacturing equipment. Current state of the art vacuum systems favor a highly integrated, systemic, and interdependent processing approach. One example of such a vacuum system is found in U.S. Pat. No. 5,186,718 assigned to Applied Material, Inc. of Santa Clara, Calif. In order to decrease pump-down time of various vacuum system components, additional vacuum stages are included resulting in a vacuum gradient from component to component. The objective behind such a system is to lower the pressure differential between each adjacent component which are in selective communication with one another. This approach results in reducing the time needed to pump down components such as the load lock and the processing chambers following loading of wafers into the chambers. Additionally, in order to maximize the efficiency of the system, the components are adapted to serve multiple functions.

In particular, present-day systems do not provide independent load locks which interface directly with process chambers. Rather, the load locks generally are interposed between a front-end environment and a transfer chamber. The process chambers and load locks are related by the operation of a transfer robot which shuttles wafers between the two system components. As shown in FIG. 1, the process chambers 104 share a single robot 120 so that scheduled or unscheduled interruption of the robot's operation prevents the use of all process chambers in the cluster tool. Also, following maintenance performed on constant-vacuum components, such as the transfer chamber 102, the components must be pumped down again before processing can resume. Depending on the component, pump-down time may significantly limit throughput. A typical transfer chamber, for example, requires a pump-down time in excess of eight hours. Thus, increasing the number of constant-vacuum components drastically increases downtime and, consequently, decreases throughput.

A need therefore exists for greater independence of process chambers, fewer constant-vacuum components, and reduced operating expenses caused by manufacturing of larger systems and related maintenance of system components.

SUMMARY OF THE INVENTION

One aspect of the present invention provides a semiconductor manufacturing system having dedicated load locks for each process chamber. The load lock cycles between ambient pressure and a vacuum condition and is attached directly to the process chamber. An external robot services the load lock by transferring wafers from a wafer cassette to the load lock under atmospheric conditions. An internal load lock robot services the process chamber mounted to the load lock.

Another aspect of the present invention provides a top loading mechanism incorporated into the load lock. The loading mechanism includes a vertically movable lid connected to a motion actuator and stabilized by guide rods disposed through the lid. The external robot transfers wafers to the load lock and positions them below the raised lid and onto a wafer lifting mechanism. The wafer and the lid are then simultaneously lowered until the lid hermetically engages a sealing surface on a cover of the load lock.

The invention further provides a wafer lifting mechanism incorporated into the load lock capable of handling one or more wafers and enables the load lock to serve as a storage or cool down chamber. In one embodiment, the wafer lifting mechanism includes a plurality of lift pins disposed through the bottom of the load lock. The lift pins are selectively lowered and raised to position a wafer between the either the front-end or the processing chamber. In a second embodiment, two pairs of lift forks are disposed in the load lock to effect a transfer of storage. Each pair of forks is capable of independent vertical and rotational movement and is adapted to raise and lower a single wafer to one or more positions within the load lock.

Still another aspect of the present invention provides a transfer robot having a single degree of freedom located within the load lock. The robot includes a blade adapted to support a wafer to transfer wafers to and from a process chamber connected to the load lock. In its extended position, the robot leaves a central portion of the load lock unobstructed so that a wafer may be lowered or raised below or above the plane of movement of the robot and blade.

The invention further provides a method for transferring wafers from a load lock into a processing chamber. An atmospheric robot is provided to transfer wafers to a lifting mechanism located in a load lock. The wafer is then lowered onto an internal transfer robot centrally located in the load lock. Finally, the wafer is extended into the process chamber through a slit valve which is subsequently sealed. The wafer is retrieved by reversing these steps.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3 is a top view of the present invention with the lid and cover removed to show the transfer robot;

FIG. 5 is a perspective cutaway view of the second embodiment;

DETAILED DESCRIPTION OF A PREFERRED EMBODIMENT

Figure 1:
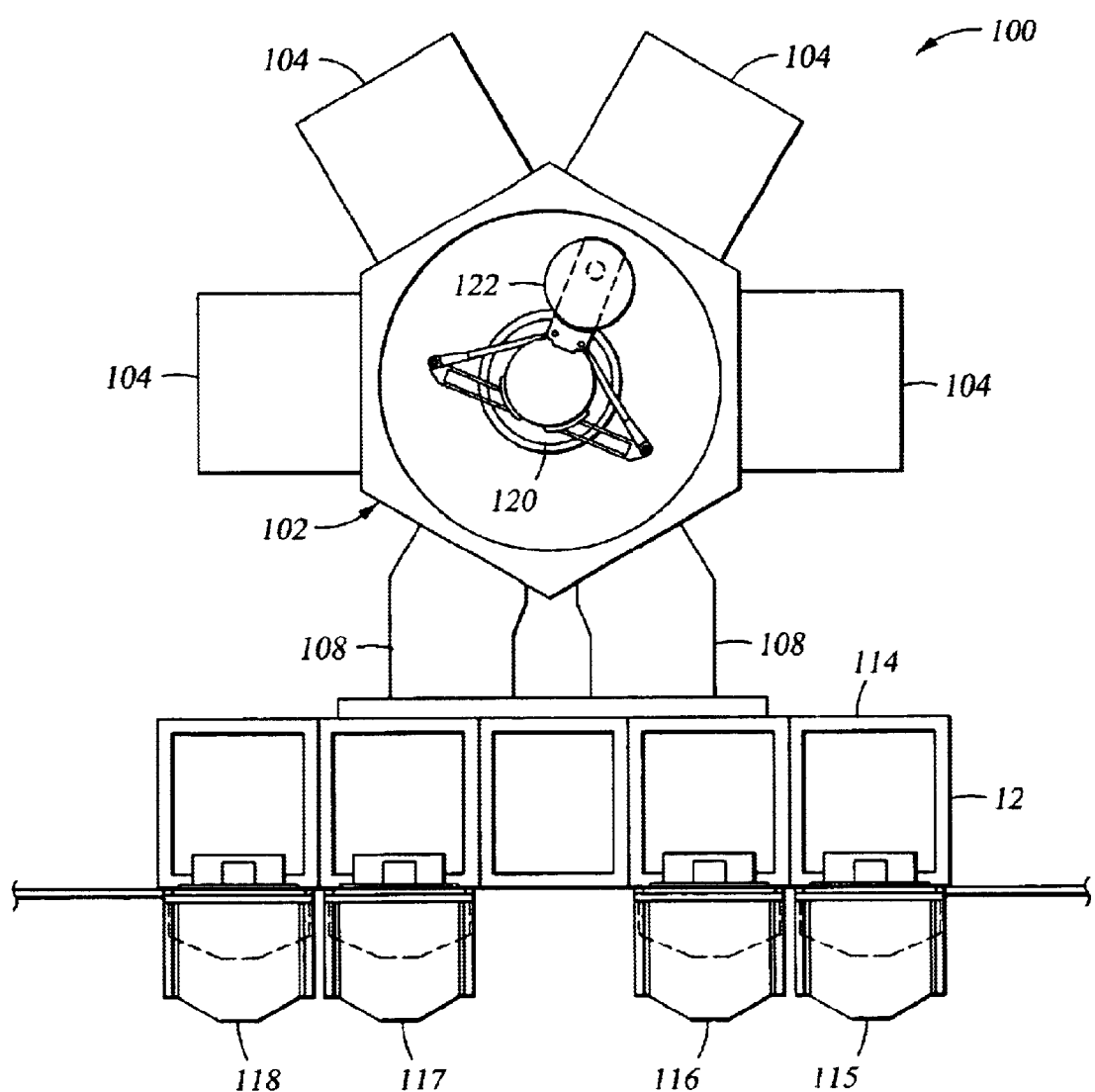
FIG. 1 is a top view of a typical cluster tool.
Figure 2:
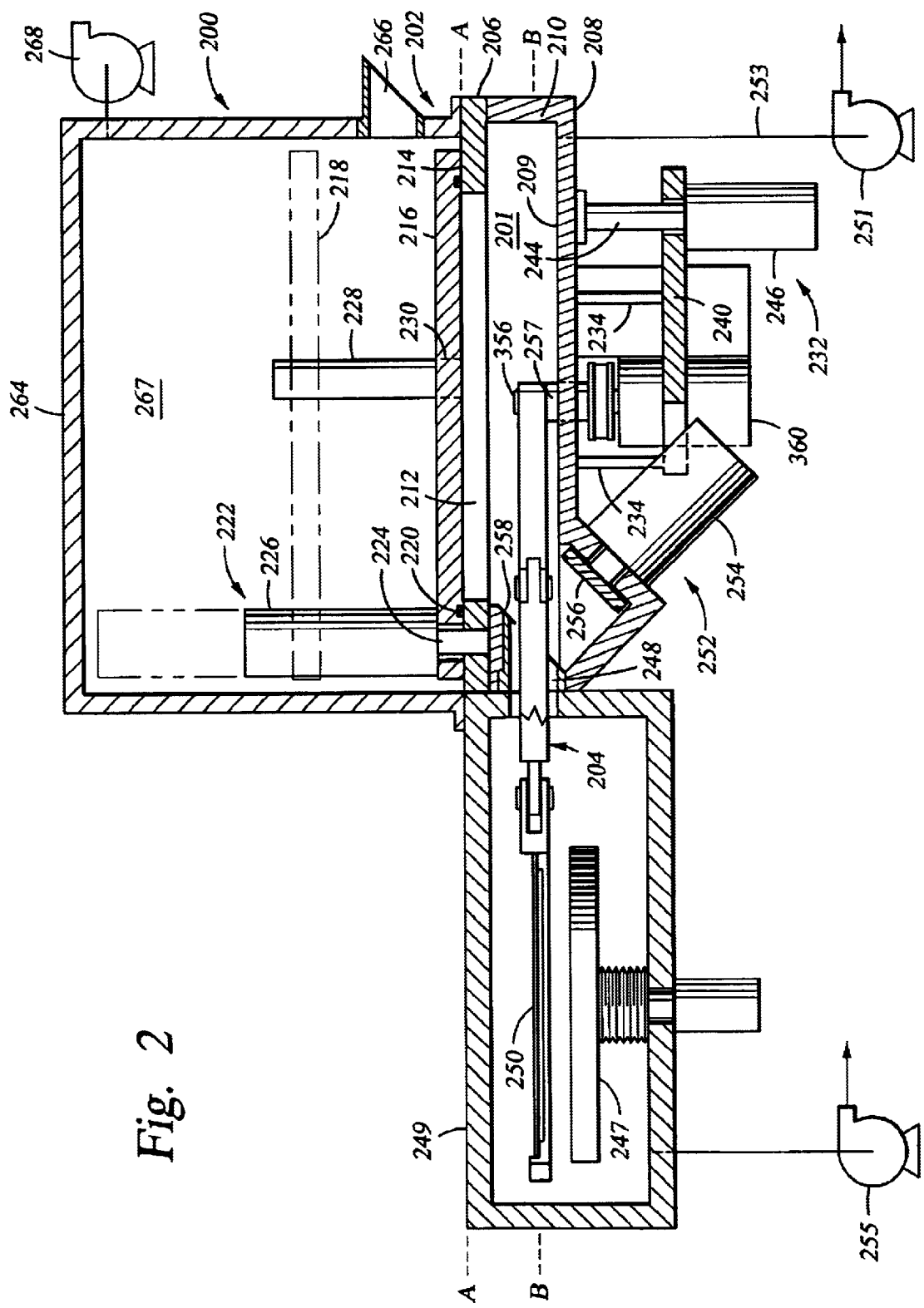
FIG. 2 is a partial cross sectional side view of a first embodiment of the present invention.

FIG. 2 is a partial cross sectional view of a first embodiment of a load lock 200 generally comprising a chamber body 202 having a transfer robot 204 disposed within a chamber cavity 201 preferably having a capacity of 10–12 liters. The chamber body 202 is defined by a cover 206, a bottom 208 substantially parallel to the cover 206, and a chamber wall 210 intermediate of the cover 206 and bottom 208. Preferably, the bottom 208 and chamber wall 210 comprise a monolith, i.e., they are machined or otherwise fabricated of a single piece of material. The cover 206 defines an aperture 212 through which wafers are vertically transferred into and out of the chamber cavity 201. Additionally, the cover 206 has a first sealing surface 214 which defines a sealing plane A. In the preferred embodiment, a vertically movable lid 216 having a second seating surface 218 is adapted to substantially cover the aperture 212 and form a seal with the first sealing surface 214. An O-ring 220 disposed on the lower side of the lid 216 ensures a hermetic seal between the lid 216 and the cover 206. The lid 216 is connected to an actuating mechanism 222 which includes an elongated shaft 224 fastened to the cover 206 and a stepper motor 226 mounted to the lid 216. The shaft 224 is coupled to the lid 216 at a first end and the stepper motor 226 at a second end. Guide rods 228 (two are shown) are disposed through bores 230 formed in the lid 216 to stabilize the movement of the lid 216. The guide rods 228 are disposed about the perimeter of the lid 216 to provide clearance in a central portion defined therebetween so that a wafer can be received in the central portion.

FIG. 2 shows a lifting mechanism 232 located below the load lock 200 to raise and lower a wafer from an external robot blade or other wafer supporting device. The lifting mechanism 232 includes a plurality of radially extending wafer support pins 234 slidably disposed through the bottom 208 of the load lock. Each pin 234 is supported at one end on a mounting plate 240 and terminates in an upper spherical portion. The mounting plate 240, in turn, is connected to a vertically movable shaft 244 capable of raising and lowering the mounting plate 240 and, consequently, the support pins 234. The shaft 244 is connected to the mounting plate 240 at one end and is moved vertically up and down by an actuator 246, preferably a pneumatic cylinder or stepper motor, connected at another end.

The chamber wall 210 has an aperture 248 defined therein to enable horizontal wafer transfer along a transfer plane B into an attached process chamber 249 which houses a wafer support member 247. The aperture 248 is selectively sealed by a sealing apparatus 252, such as a slit valve, disposed through the bottom 208 of the load lock 200. A pneumatic cylinder 254 actuates a sealing door 256 to engage a seating surface 258 on the chamber wall 210. One slit valve which can be used to advantage is discussed in detail in U.S. Pat. No. 5,226,632 assigned to Applied Materials, Inc., of Santa Clara, Calif., the entirety of which is incorporated herein by reference. Other sealing apparatuses are known in the industry and can be used in the present invention.

In order to create a vacuum condition in the chamber cavity 201 while the sealing door 256 seals the aperture 248 and the lid 216 seals the aperture 212 a vacuum pump 251 is connected to the chamber body 202 by a vacuum hose 253. The vacuum pump is preferably a roughing pump but a cryogenic pump or turbomolecular pump may also be used either in tandem with or instead of the roughing pump. Similarly a vacuum pump 255 (shown schematically) is connected to the process chamber 249 to create a vacuum condition therein during processing. Although separate vacuum pumps 251, 255 are shown for the load lock chamber 200 and the process chamber 249, the same pump may be used to service both chambers.

FIG. 3 is a top view of the load lock 200 showing the internal transfer robot 204. The transfer robot 204, capable of horizontal extension along the transfer plane B (shown in FIG. 2), is disposed above a chamber floor 209 and is shown in a retracted position. The robot 204 comprises a blade 262 to support a wafer 250 and a linkage 352 connected between the blade 262 and one or more actuators. The transfer robot linkage 352 includes a first drive arm 354 connected to a first pivot pin 356 extending perpendicularly from a first end, and a first strut 358 pivotally connected to a second end at a first pivot joint 372.

Referring back to FIG. 2, a bearing casing 257, containing a plurality of ball bearings (not shown), is shown vertically disposed through a floor bore. The casing 257 is adapted to receive the first pivot pin 356 therethrough and ensure smooth rotation of the first pivot pin 356 within the casing 257. O-rings (also not shown) located at each end the casing 257 provide an airtight seal between the load lock 200 and the environment.

Referring again to FIG. 3, the first pivot 356 mounts the first drive arm 354 above the floor 209 such that the length of the first drive arm 354 rotates substantially parallel to the floor 209 along the transfer plane B. A drive arm actuator 360 located below the bottom 208 and is connected to the first pivot pin 356 to impart rotation to the first drive arm 354. The drive arm actuator 360 can be any known actuator, such as a stepper motor for example.

A second drive arm 354', second pivot pin 356' and bearing casing 357' (shown in phantom), and second strut 358' symmetrically compliment the first drive arm 354, first pivot pin 356 and bearing casing 257, and first strut 358. Accordingly, the second drive arm 354' is perpendicularly connected to the second pivot pin 356' at a first end and pivotally connected to the second strut 358' at a second pivot joint 372'. A drive member 374, such as a belt shown in phantom form in FIG. 3, couples the second drive arm 354' to the drive arm actuator 360 assuring symmetrical extension of the linkage 352. Alternatively, a separate actuator could be employed to drive the second drive arm 354'. The second drive arm 354' is suspended above the floor 209 by the second pivot pin 356' such that the second drive arm 354' rotates substantially parallel to the floor 209 along the transfer plane B coplanar with the first drive arm 354.

A first end of the first strut 358 is pivotally connected to the blade 262 at a first wrist joint 270, while a first end of the second strut 358' is pivotally connected to the blade 262 at a second wrist joint 270'. The first and second wrist joints 270. 270' define a leading axis C. Similarly, the first and second pivot joints 372, 372' define a lagging axis D. A ramped backstop 271 biases the blade 262 toward the aperture 248 such that axis C leads axis D by a short distance (a few millimeters). The backstop 271 ensures that axis C and axis D retain their relationship and that the blade 262 is always moved outward upon counterclockwise rotation of the first drive arm 354 and inward upon clockwise rotation of the first drive arm 354.

In the retracted position of the transfer robot 204, the first and second drive arms 354, 354' and first and second struts 358, 358' rest along the chamber wall 210 such that a central portion of the chamber cavity 201, having a diameter approximately equal to the wafer 250, is occupied only by the blade 262. In a fully extended position, a phantom transfer robot 204' shows the central portion of the chamber cavity 201 unoccupied. In this position, a wafer may be vertically transferred above and below the transfer plane within the central portion of the chamber cavity 201 by the transfer assembly 232.

When the drive arm actuator 360 (shown in FIG. 2) imparts simultaneous counterclockwise and clockwise rotation to the first drive arm 354 and second drive arm 354', respectively, the linkage 352 and blade 262 are moved along the transfer plane B. To keep the blade 262 directed perpendicularly to the aperture 248, an interlocking mechanism is preferably housed in a wrist 14 to assure equal and opposite angular rotation of each strut 358 and 358'. The interlocking mechanism may take on many designs, including intermeshed gears or straps around the pivots in a figure 8 pattern or the equivalent. One preferred interlocking mechanism 10 is a pair of intermeshed gears 12 as shown in FIG. 3. The gears 12 are loosely meshed to minimize particulate generation.

Figure 4A:
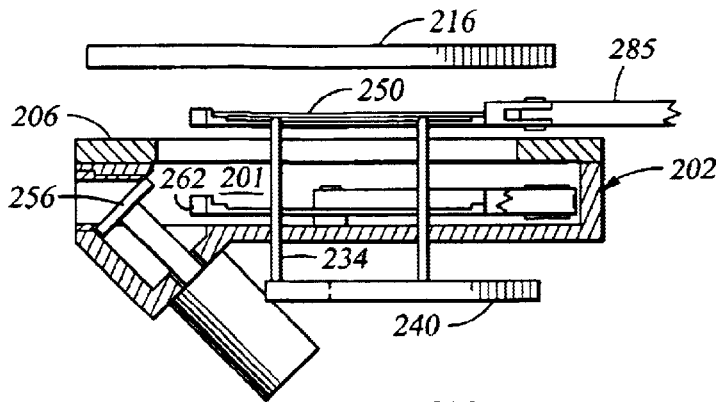
FIGS. 4a–4d are a series partial side elevational views of the present invention showing a wafer transfer within the first embodiment.
Figure 4B:
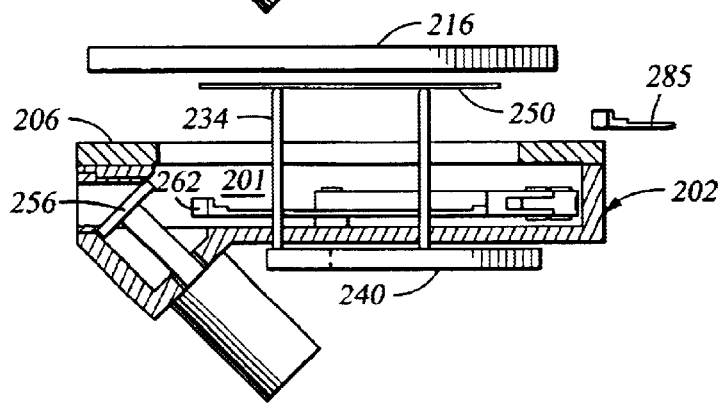
Figure 4C:
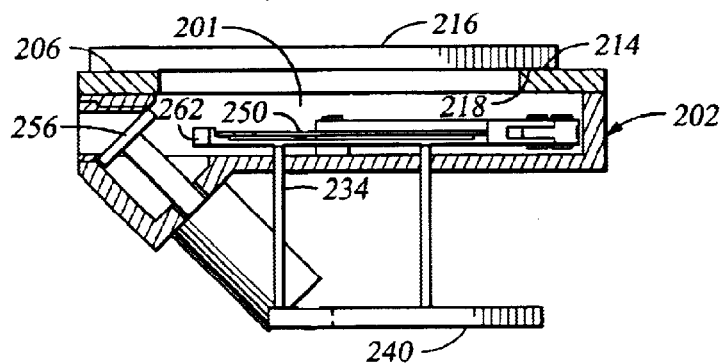
Figure 4D:
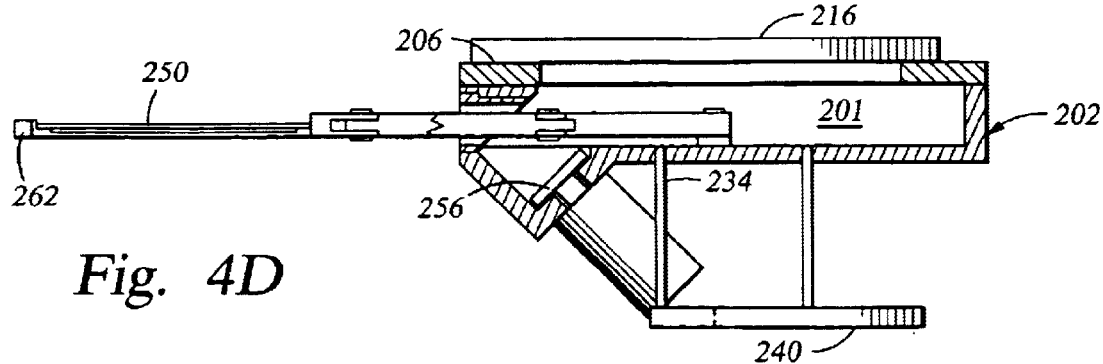

FIGS. 4a–4d show a wafer transfer within the present invention. Initially, an atmospheric robot blade 285 positions a wafer 250 between the raised lid 216 and the cover 206, and over the blade 262 as shown in FIG. 4a. In order to receive the wafer 250, the lifting mechanism 232 raises the pins 234 above the atmospheric robot blade 285 while the atmospheric robot blade 285 withdraws from above the chamber body 202 as shown in FIG. 4b. FIG. 4c shows the lifting mechanism 232 lowering the pins 234 until the wafer 250 is deposited on the blade 262. The support pins 234 then continue to retract below the transfer plane B. Simultaneously, the lid 216 is lowered onto the cover 206 causing the first seating surface 214 and the second seating surface 218 to sealingly engage (shown in FIG. 4c). The vacuum pump 251 (shown in FIG. 2) then pumps the chamber cavity 201 down to a pressure substantially equal to the base pressure of the process chamber 249 (also shown in FIG. 2). Once a transfer pressure is reached, the sealing door 256 is opened to provide fluid communication between the process chamber 249 and the load lock chamber 200. As shown in FIG. 4d, the blade 262 is then extended into the process chamber 249 to deliver the wafer 250 above the wafer support member 247 (shown in FIG. 2) where a lift mechanism (not shown) can position the wafer 250 onto the wafer support member 247 for processing. After delivering the wafer 250 into the process chamber 249, the blade 262 is retracted and the sealing door 256 is closed. The process chamber 249 is then pumped down to its base pressure and the wafer 250 undergoes processing. Upon completion of the processing step, the steps described above are performed in reverse. Specifically, the sealing door 256 is opened and the blade 262 is extended into the process chamber 249 to retrieve the wafer 250. The blade 262, carrying the wafer 250, is retracted and the sealing door 256 is closed. The chamber cavity 201 is then pumped up to ambient pressure. The actuating mechanism 222 raises the lid 216 while the lifting mechanism 232 raises the pins 234 and, consequently, the wafer 250, above the transfer plane of the atmospheric robot blade 285. The atmospheric robot blade 285 is then extended beneath the wafer 250 and the lifting mechanism 232 lowers the pins 234 leaving the wafer 250 on the atmospheric robot blade 285.

The operational steps and pressure cycle described above is one of various possibilities. In particular, a preferred algorithm involves performing steps simultaneously, such as raising the lid 216 and extending the blade 262, for example. Additionally, the relative pressures of the load lock 200 and process chamber 249 may be adjusted to optimize performance and increase throughput. To prevent the influx of contaminants into the process chamber 249, the load lock 200 may be evacuated to a pressure less than that of the process chamber 249 prior to opening the sealing door 256. Those skilled in the art will readily identify other operational solutions without departing from the scope of the present invention.

Figure 6:
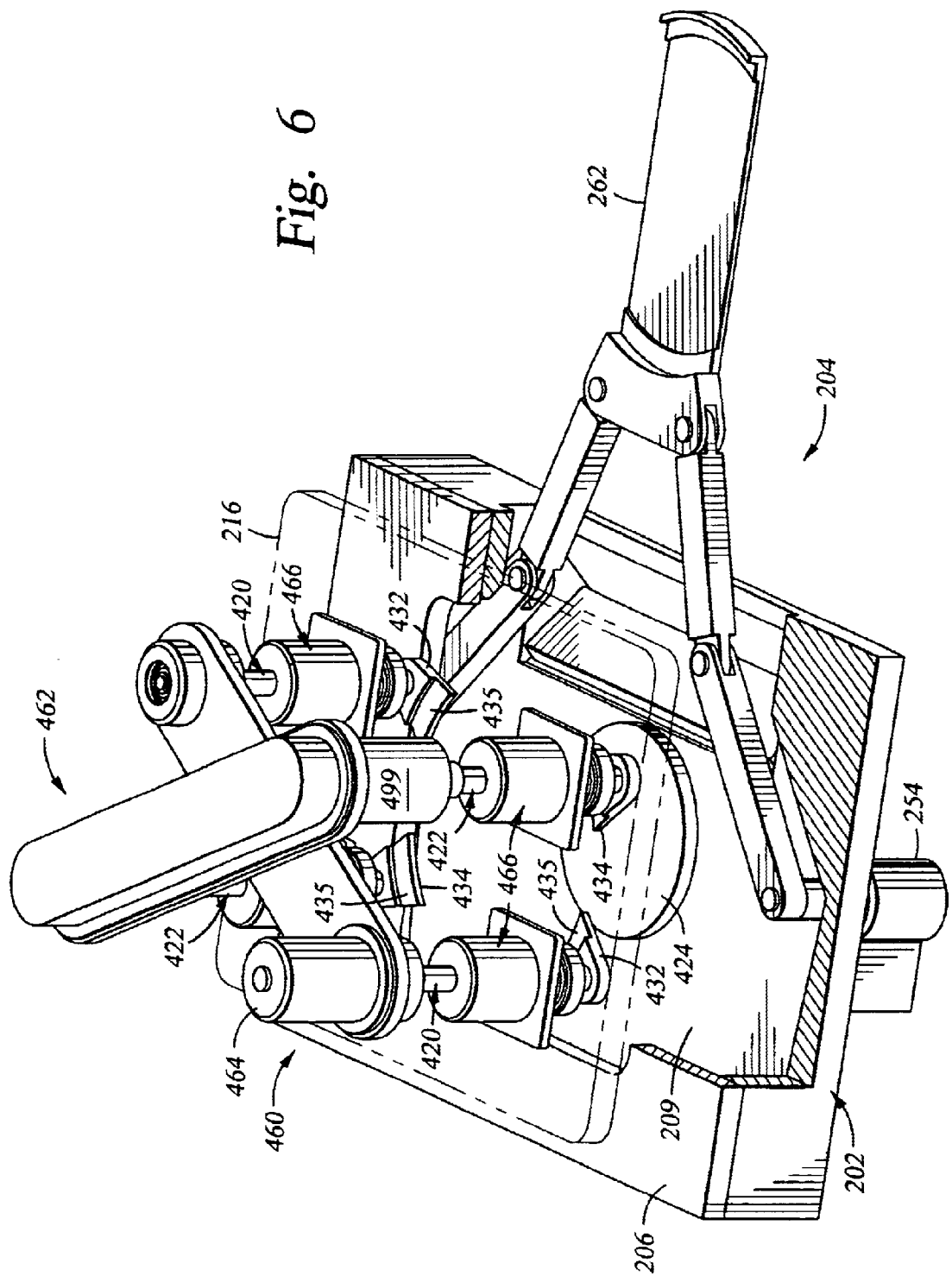
FIG. 6 is a perspective cutaway view of the second embodiment.
Figure 7:
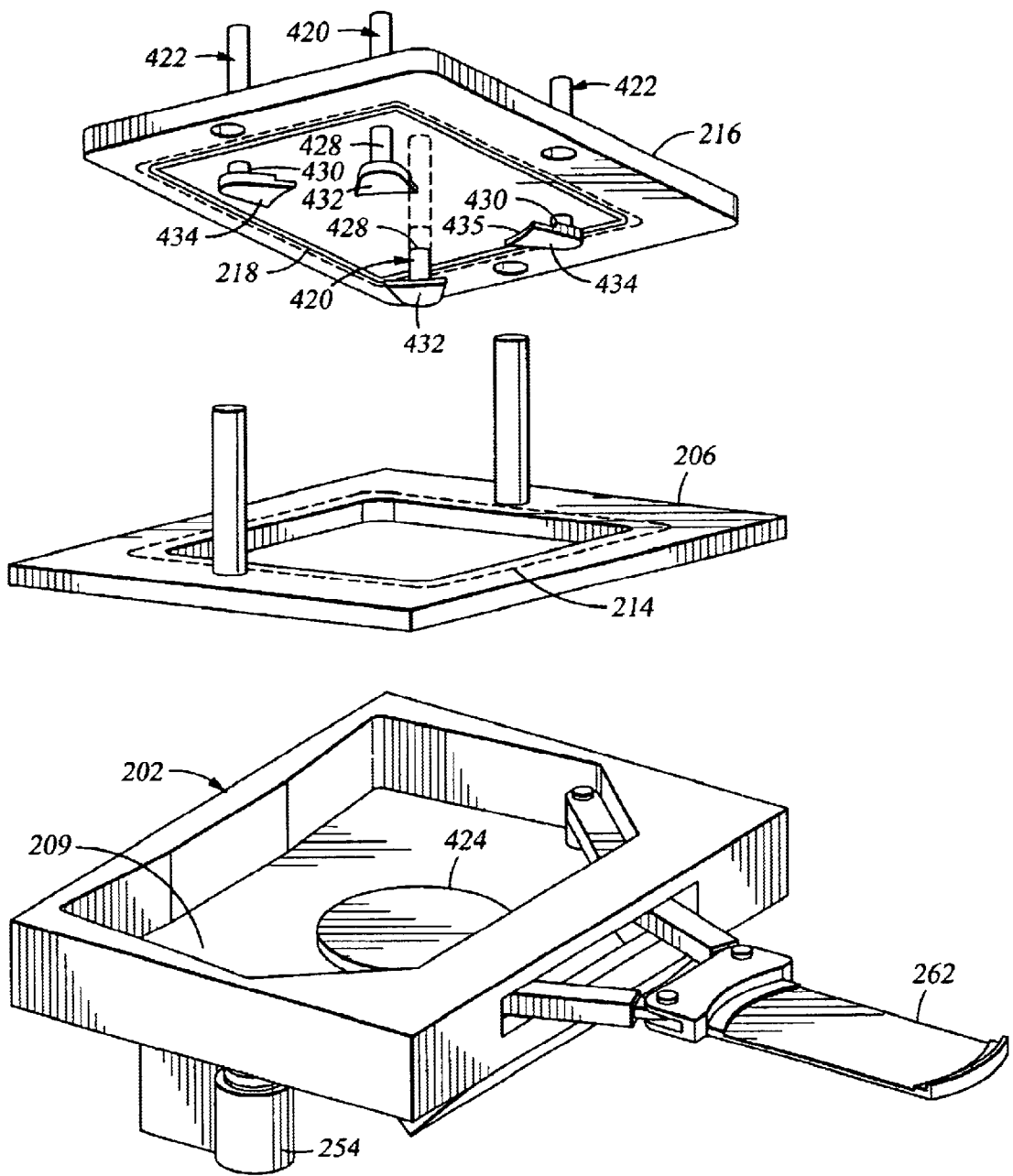
FIG. 7 is an exploded view of the present invention showing a second embodiment.

FIGS. 5–9 show a second embodiment of the present invention adapted to handle two wafers. The second embodiment generally comprises a multi-wafer transfer assembly. The transfer assembly includes a first pair of cooperating lift forks 420 coupled to a first Z-θ actuating assembly 460 (shown in FIGS. 6 and 9) and second pair of cooperating lift forks 422 coupled to a second Z-θ actuating assembly 462 (shown in FIG. 6). As shown in FIG. 6 the Z-θ actuating assemblies 460, 462 are mounted to the lid 216 to impart vertical (Z) and rotational (θ) motion to the lift forks 420, 422 respectively. The Z-θ actuating assemblies 460, 462 are discussed in detail below. A wafer support is 424 provided to support a wafer thereon below the transfer plane of internal robot 204.

The first pair of cooperating lift forks 420 and second pair of cooperating lift forks 422 are each adapted to vertically transfer a single wafer between a plurality of positions. The plurality of positions define a cylindrical transfer zone T (shown in FIG. 5) in the central portion of the chamber body 202 having a diameter equal to a wafer and a height equal to the distance between the wafer support 424 and the lower surface of the raised lid 216. The wafer support 424 is shown as a cylindrical raised portion disposed through or positioned on the floor 209 and having a diameter less than a wafer. However, the wafer support 424 could be any design adapted to suspend the wafer above the floor 209 and below the transfer plane of the internal robot 204 while also preferably leaving a perimeter portion of the wafer exposed. An alternative embodiment may use a plurality of fixedly attached pins disposed through the floor 209. Another embodiment may provide indentations in the wafer support sidewall to accommodate rotating forks 420, 422 discussed in detail below.

Each pair of forks 420, 422 is comprised of a pair of rods 428, 430 located outside the transfer zone T, and a pair of lifting elements 432, 434. The rods 428, 430 are vertically slidably disposed through the lid 216 and each pair is connected at an upper end to the Z-θ actuating assemblies 460, 462 (shown in FIG. 6). The lifting elements 432, 434 are perpendicularly connected to a lower end of the rods 428, 430 and are selectively rotated about the axis of the rods 428, 430 into and out of the transfer zone T by the Z-θ actuating assemblies, 460, 462. The lifting elements 432, 434 have a curvilinear beveled edge 435 adapted to securely support a portion of a wafer edge when they are rotated into the transfer zone T such that they point toward one another. The lifting elements 432, 434 of each pair of lift forks 420, 422 can also be rotated away from one another to a distance greater than the diameter of the transfer zone T, thereby allowing the other pair of lift forks 420, 422 to freely transfer a wafer through the transfer zone T.

Figure 8:
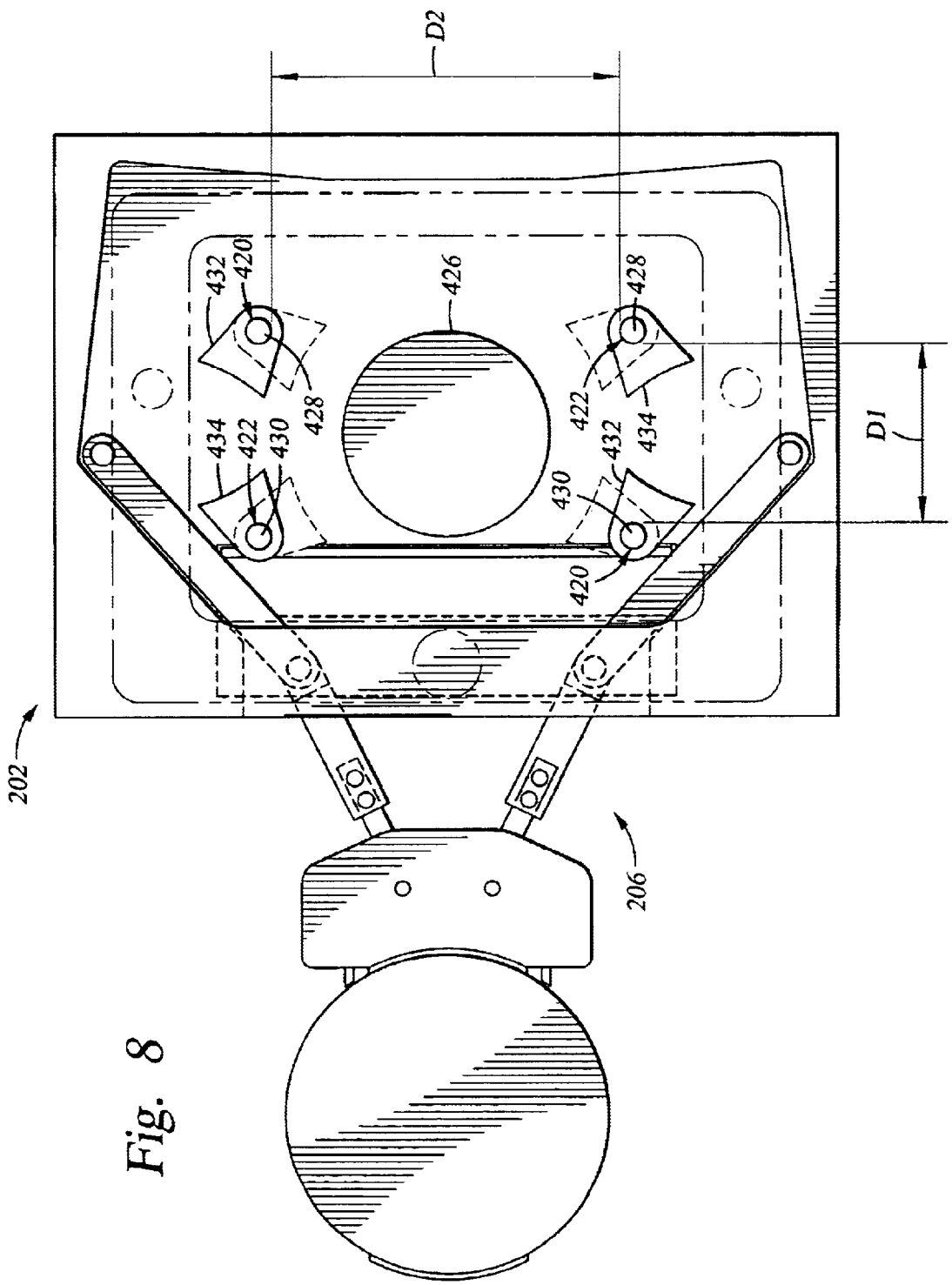
FIG. 8 is a top view of the second embodiment of the present invention with the cover and lid removed.

Referring now to FIG. 8 (shown with the Z-θ actuating assemblies 460, 462 removed for clarity), the lift forks of each pair 420, 422 are positioned diagonally opposite one another to receive a wafer therebetween. The lift forks 420, 422 may be viewed as a parallelogram having a width D1 and a length D2, wherein the limiting distance is defined by the length D2. In order for a wafer to be received by either pair of lift forks 420, 422, D2 must be at least equal to the diameter of the wafer. While D1 may be varied to any distance, D1 is preferably minimized so that the volume of the load lock 200 may be minimized.

Figure 9:
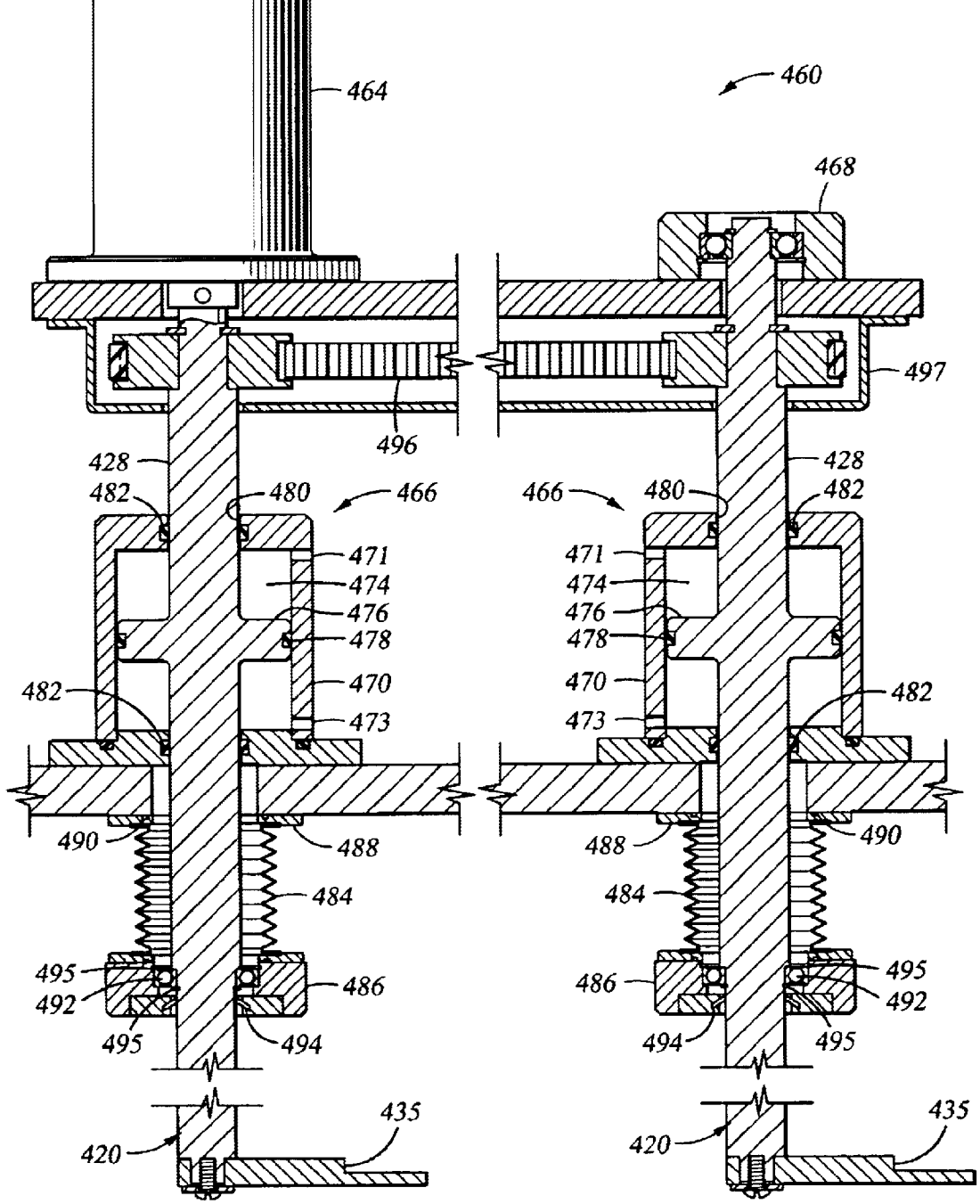
FIG. 9 is a cross sectional view of an actuating assembly.

Any number of actuators capable of generating Z-θ motion may be used to advantage in the present invention. FIG. 9 shows a partial sectional view detailing one possible actuator assembly employing a motor 464, such as a stepper motor, to impart rotational (θ) motion and a pair of pneumatic cylinders 466 to impart vertical (Z) motion. For convenience and clarity, only the first actuating assembly 460 for the first pair of forks 420 is shown. The actuating assembly 460 is generally comprised of the pair pneumatic cylinders 466 through which the rods 428 are slidably disposed, the motor 464 to which the one of the rods 428 is attached, and a ball bearing assembly 468 to which the other rod 428 is attached. Each of the pneumatic cylinders 466 consists of a cylinder body 470 having an upper inlet/exhaust port 471 and a lower inlet/exhaust port 473 formed therein. The cylinder body 470 define a cavity 474 in which a piston 476, fixedly attached to the rods 428, is housed. An annular lip seal 478 provided around the external cylindrical surface of the piston 476 assures a hermetic seal between the piston 476 and body 470. The rods 428 extend through bores 480 formed at each end of the cylinder body 470, in which bores 480 are located O-ring seals 482. The O-rings 482 provide airtight seals between the cavity 474 and the pneumatic cylinder's environment.

The pneumatic cylinders 466 are actuated by selectively supplying compressed air into either the upper inlet/exhaust port 471 or the inlet/exhaust port 473 through air hoses (not shown) connected to a compressor (also not shown). Specifically, the first pair of forks 420 may be lowered by delivering air to the upper inlet/exhaust ports 471 and raised by delivering air to the lower inlet/exhaust ports 473.

Vertically compressible bellow sleeves 484 located on the inner side of the lid 216 surrounds a lower portion the rods 428. The bellow sleeves 484 are attached to collars 486 at one end and mounting plates 488 having static seals 490 at another end. The collars 486 house bearing assemblies 492, allowing the rods 428 to rotate therein, and rotary seals 494 to prevent particles generated by various points of friction from escaping into the load lock chamber 200. Upper and lower rings 495 prevent the bellow sleeves 484 and collars 486 from sliding along the rods 428.

The motor 464 which imparts rotational (θ) motion to the first pair of the lift forks 420 is located above the load lock 200 at an upper end of one of the rods 428. The rotational motion is translated to the other rod of the pair 428 by a belt 496 which is housed in an elongated sheath 497. The smooth motion of the other rod of the pair 428 is ensured by the ball bearing assembly 468 through which the upper end of the other rod 428 is disposed. The motor 464 is selectively energized to synchronously rotate the pair of rods 428.

FIG. 6 shows the first and second actuator assemblies 460, 462. The second assembly 462 is substantially identical and is positioned relative to actuating assembly 460 in the form of a cross (X). A second actuator assembly motor 499 is shown mounted upside down so that occupied space is minimized. The actuator assemblies 460, 462 shown one possible embodiment for imparting movement to the lift forks 420, 422. However, those skilled in the art will recognize other embodiments which may be used to advantage the present invention.

Figure 10A:
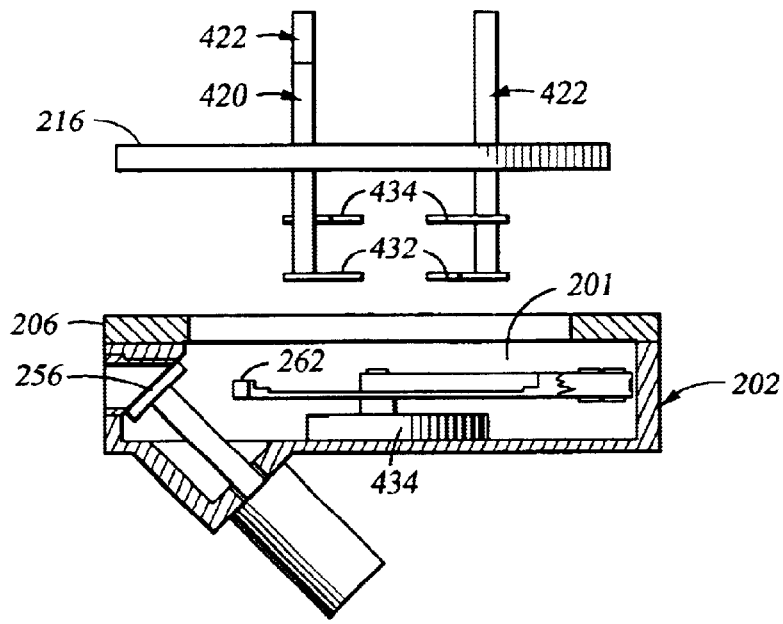
FIGS. 10a–10r are a series of partial side elevational views of the present invention showing a wafer transfer within the second embodiment.
Figure 10B:
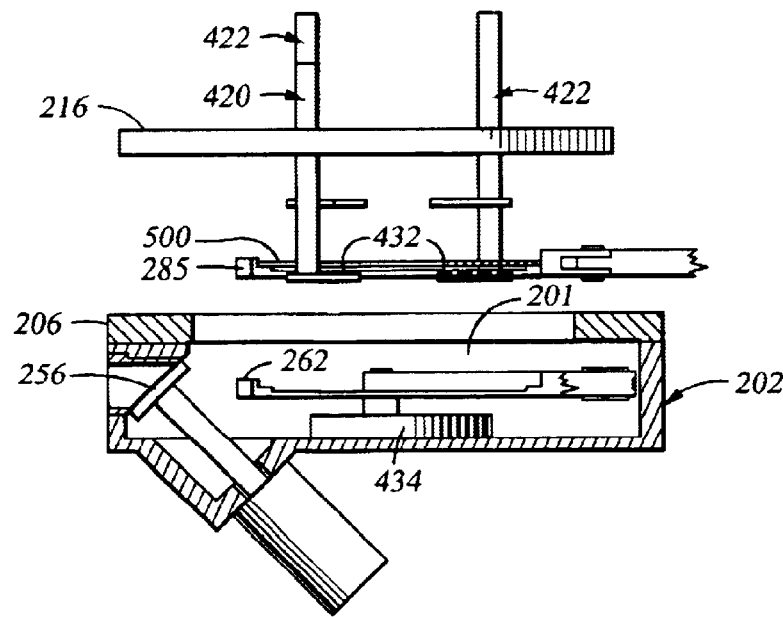
Figure 10C:
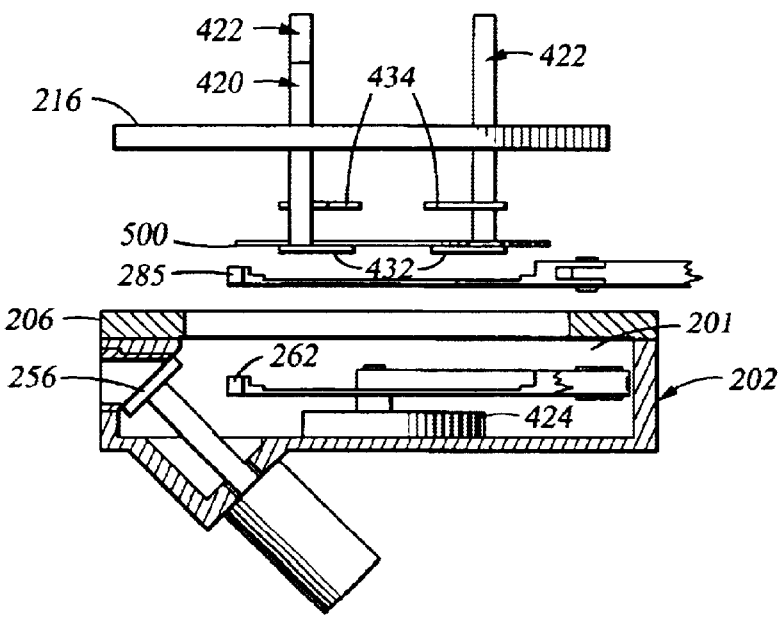
Figure 10D:
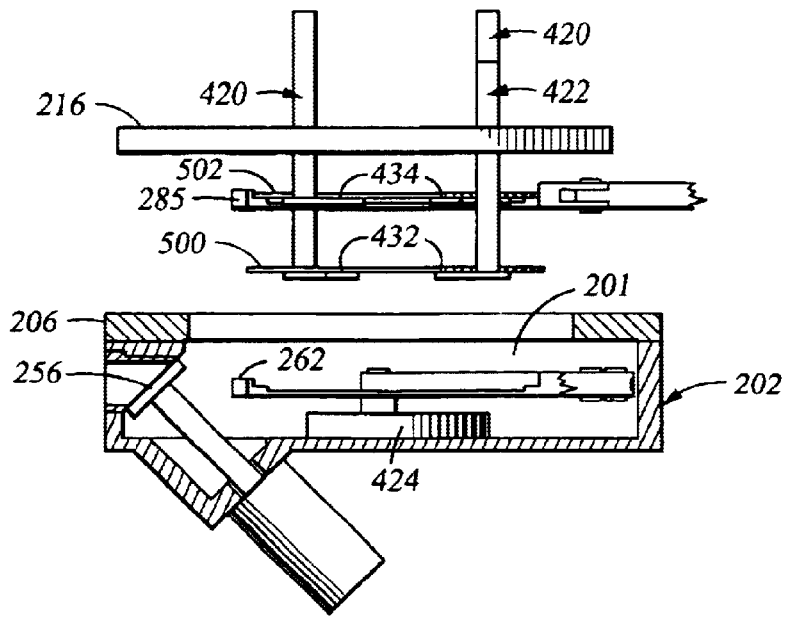
Figure 10E:
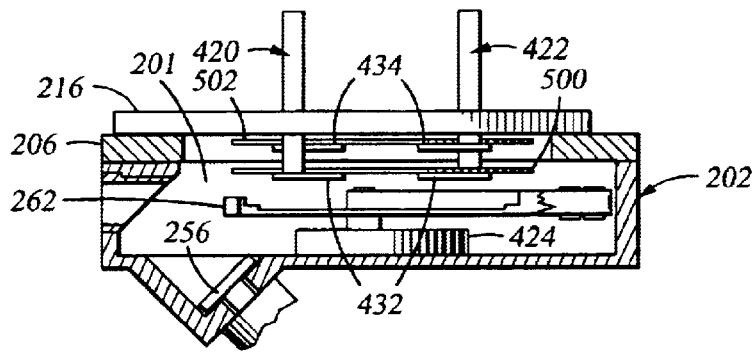
Figure 10F:
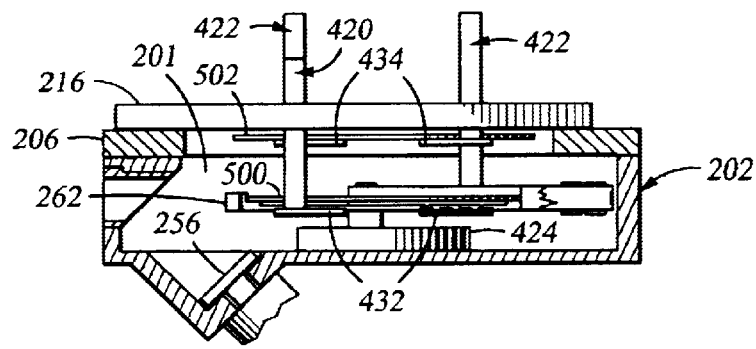
Figure 10G:
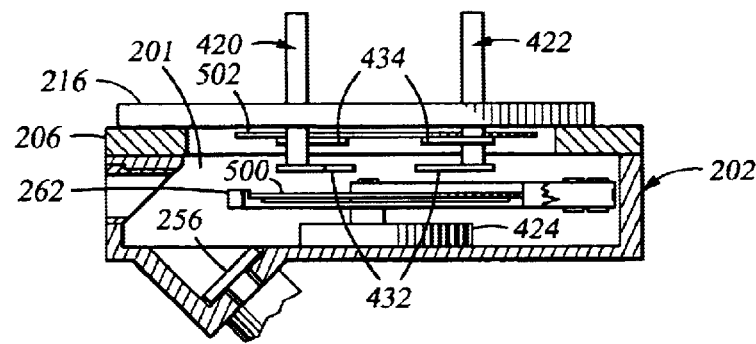
Figure 10H:
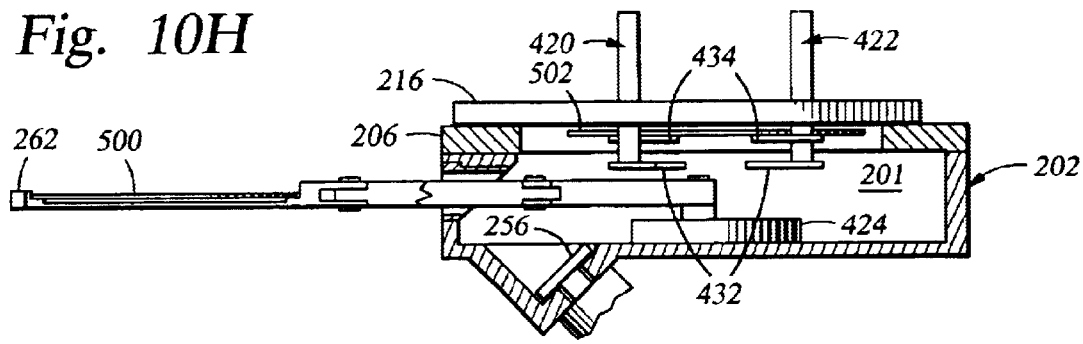
Figure 10I:
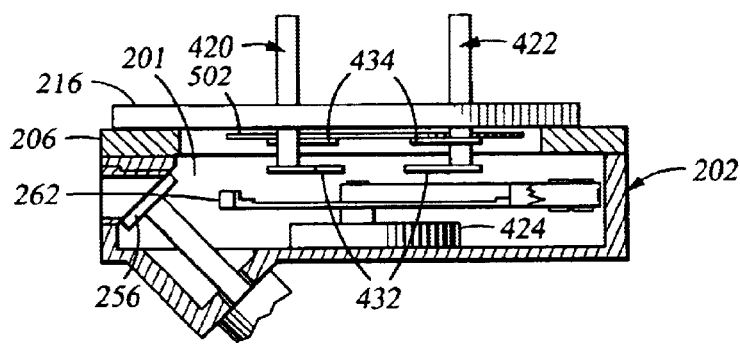
Figure 10J:
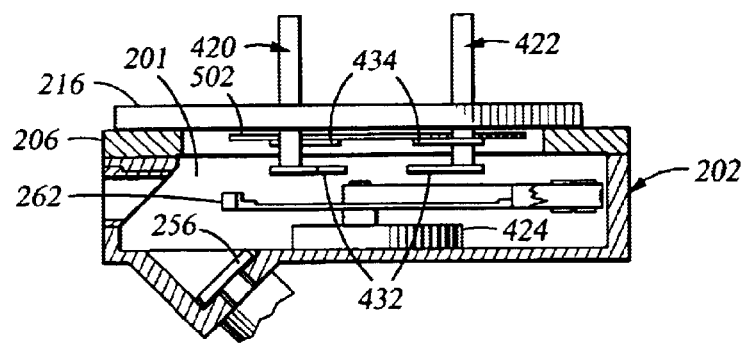
Figure 10K:
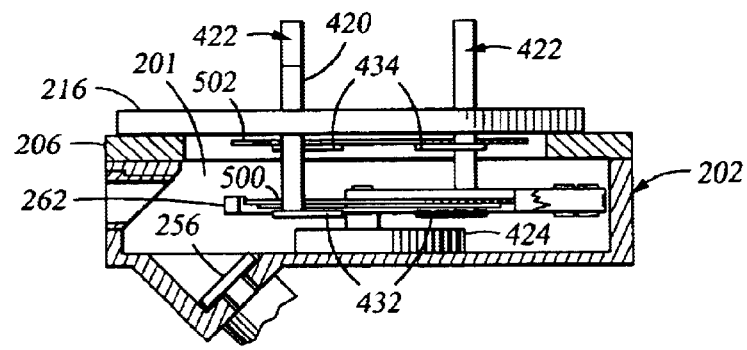
Figure 10L:
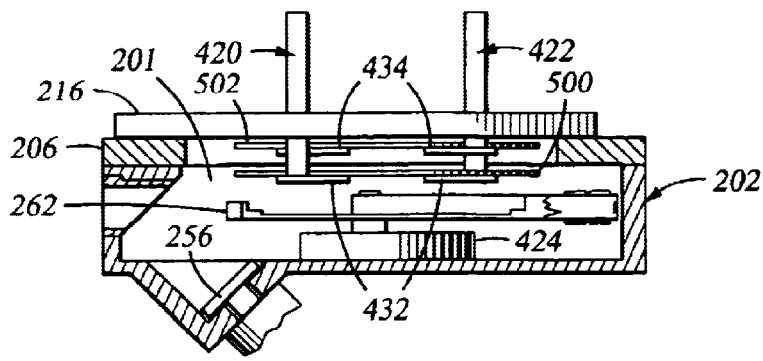
Figure 10M:
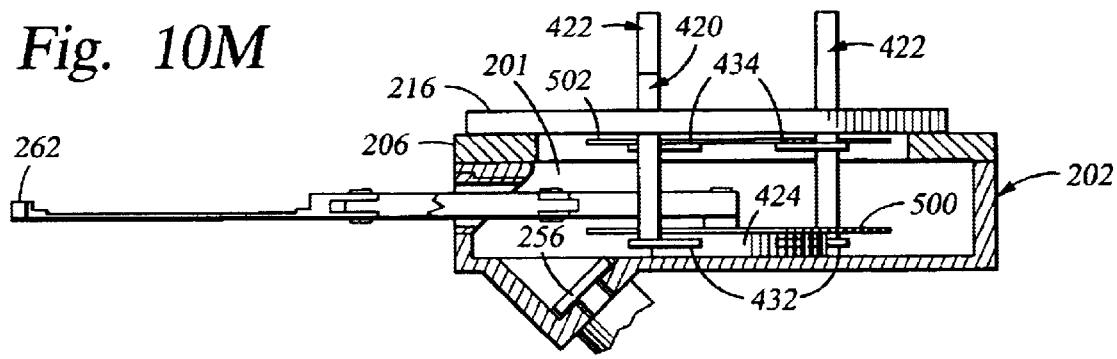
Figure 10N:
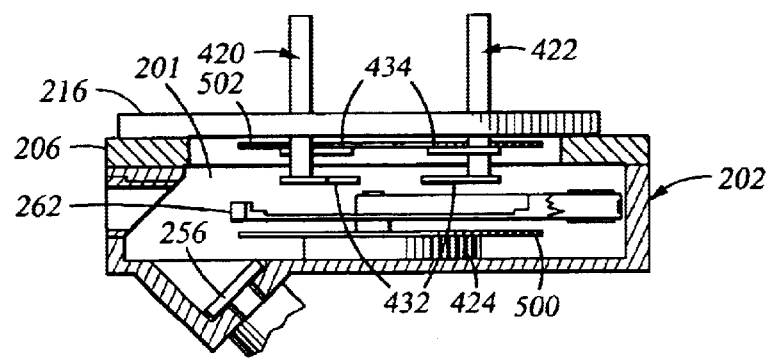
Figure 10O:
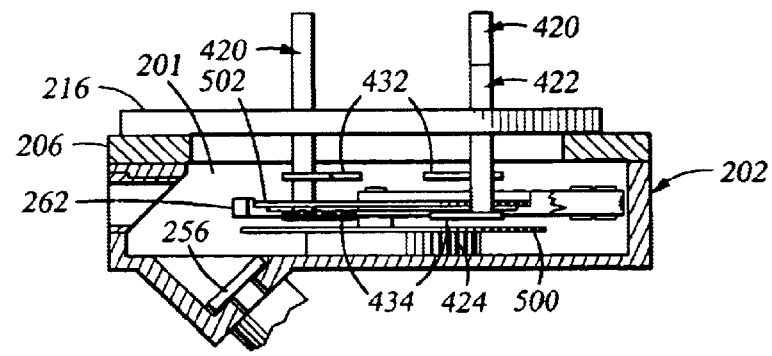
Figure 10P:
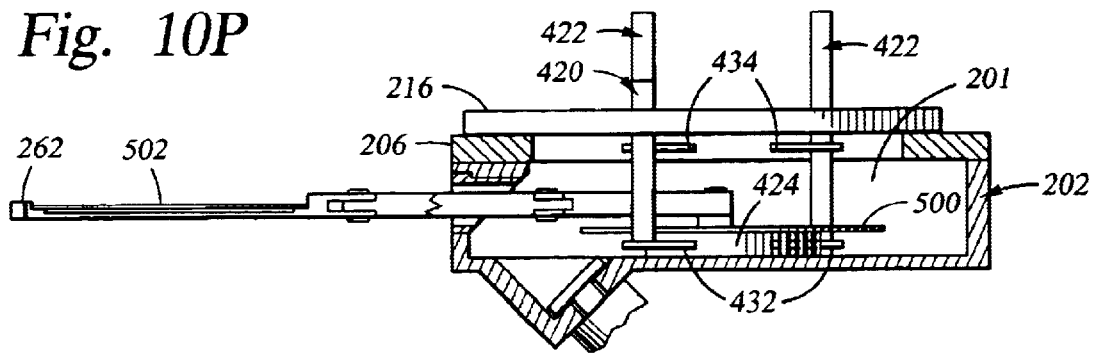
Figure 10Q:
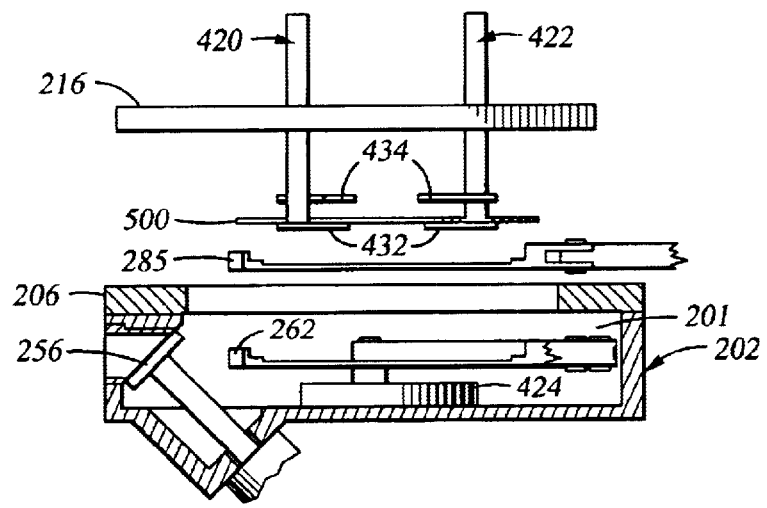
Figure 10R:
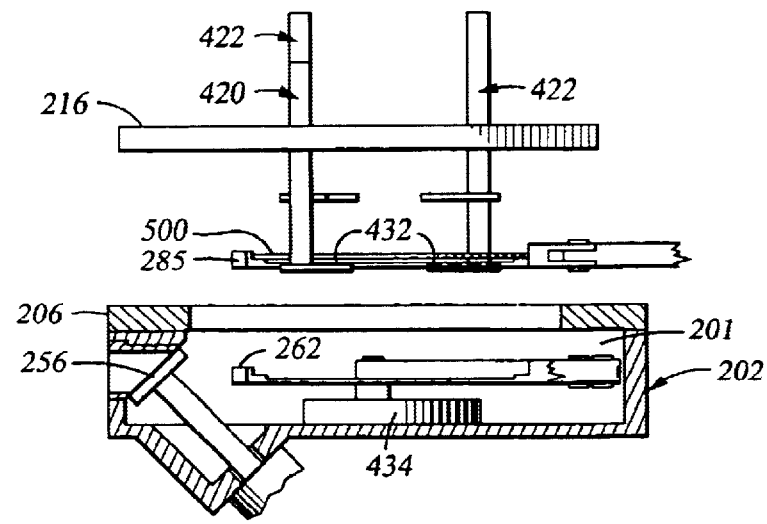

FIGS. 10a–10r is a series of partial cross sectional views describing the steps performed on wafers by the second embodiment of the present invention. FIG. 10a shows the load lock 200 with the lid 216 and lift forks 420, 422 raised, and the lift elements 432, 434 of each pair of lift forks 420, 422 pointing toward one another. The lift forks 420, 422 are vertically offset from one another so that each is positioned to receive a wafer from the atmospheric robot blade 285. In this position, the atmospheric robot blade 285 retrieves a first wafer 500 from a proximately located wafer cassette (not shown) and inserts the wafer 500 between the raised lid 216 and the cover 206 and above the lift forks 420, 422 as shown in FIG. 10b. The first pair of lift forks 420 are then raised above the transfer plane of the blade 285 thereby causing the wafer 500 to be deposited onto the lift forks 420 as shown in FIG. 10c. A second wafer 502, shown in FIG. 10d, is similarly deposited onto the second pair of lift forks 422. Once the blade 285 retracts, the lid 216 and the lift forks 420, 422 are lowered thereby sealing the load lock 200 as shown in FIG. 10e. The wafer is deposited onto the blade 262 by lowering the first pair of lift forks 420 below the transfer plane B as shown in FIG. 10f. The lift elements 432 of the first pair of lift forks 420 are rotated 90 degrees and returned to a position above the transfer plane B as shown in FIG. 10g.

Once the chamber body 202 is pumped down to a pressure substantially equal to the base pressure of the process chamber 249 (shown in FIG. 2), the sealing door 256 is opened to provide fluid communication between the process chamber 249 and the load lock chamber 202. The blade 262 is then extended into the process chamber 249 where wafer 500 is positioned in the process chamber for transfer therein as shown in FIG. 10h. After depositing the wafer 500 in the process chamber 249, the blade 262 is retracted and the sealing door 256 is closed as shown in FIG. 10i. The process chamber 249 is pumped down to its base pressure and the wafer 500 then undergoes one of various processes.

Upon completion of processing, the process chamber 249 is pumped up to a transfer pressure, the sealing door 256 is opened, as shown in FIG. 10j, and the blade 262 is extended into the process chamber 249 to retrieve the first wafer 500. The blade 262, carrying the first wafer 500, is then retracted, as shown in FIG. 10k, and the first pair of forks 420 is actuated toward the wafer 500. Upon breaching the transfer plane B, the lift elements 432 are rotated and positioned under the wafer 500 and the lift forks 420 are raised to a position above the transfer plane B to support the substrate as shown in FIG. 10l. Subsequently, the blade 262 is again extended into the process chamber 249. While the blade 262 is parked in the process chamber 249, the first pair of forks 420 are lowered below the transfer plane B to position the wafer 500 onto the wafer support member 424 as shown in FIG. 10m. In FIG. 10n the lift elements 432 are rotated and raised to a position above the transfer plane B and the blade 262 is again retracted. Simultaneously, as shown in FIG. 10o, the second pair of forks 422 is actuated toward the transfer plane B to position the second wafer 502 onto the blade 262. Once the wafer 502 is positioned on the blade 262, the second pair of forks 422 is rotated and actuated to a position above the transfer plane B. The blade 262 is then extended into the process chamber 249 carrying the wafer 502 as shown in FIG. 10p. Simultaneously, the first pair of forks 420 is lowered to retrieve the wafer 500 from the wafer support 424, also shown in FIG. 10p. Once the wafer 500 is raised above the transfer plane B, the blade 262 is retracted. Upon retraction of the blade 262, the sealing door 256 is closed and the process chamber 249 is pumped down to its base pressure for processing wafer 502. Simultaneously, the load lock 200 is pumped up to ambient pressure. In order to exchange the wafer 500 for another wafer, the lid 216 and both pairs of forks 420, 422 are raised as shown in FIG. 10q. FIGS. 10r and 10r show the atmospheric robot blade 285 extended below the first wafer 500 at which point the first pair of forks 420 lowers the wafer 500 onto the atmospheric robot blade 285. The first pair of forks 420 is then rotated. The atmospheric robot blade 285 is retracted to dispose of the wafer 500 in the wafer cassette (not shown) and again extended carrying an unprocessed wafer which is positioned on the second pair of forks 422. The forks 420, 422 and lid 216 are then lowered and the steps are repeated.

Figure 11:
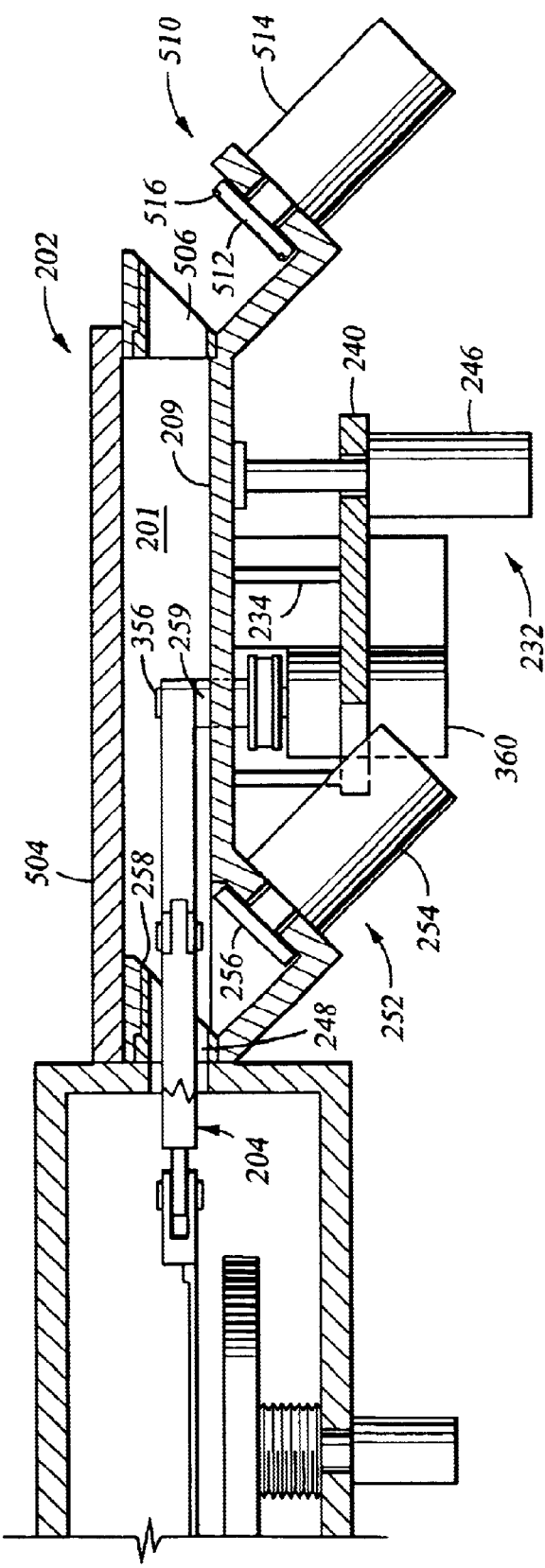
FIG. 11 is a partial cross sectional side view of an alternative embodiment of the present invention.

In another embodiment shown in FIG. 11, the load lock 200 shown in FIG. 2 is modified to include a solid cover 504 and a slit valve aperture 506 formed in the chamber wall 210 at the rear of the load lock 200 providing back-loading access for an atmospheric robot (not shown) to transfer wafers. A slit valve apparatus 510 located adjacent and behind the load lock 200 is selectively activated to seal the load lock chamber 200. The slit valve apparatus 510 generally comprises an elongated door 512 coupled to an actuator 514 to move the door 512. An o-ring 516 is disposed on a sealing surface of the door 512 to hermetically seal the load lock 200. The slit valve apparatus 510 may be any commercially available slit valve apparatus such as the one disclosed in U.S. Pat. No. 5,226,632 assigned to Applied Material, Inc., of Santa Clara, Calif., which was incorporated by reference herein. Alternatively, any other sealing apparatus, such as a gate valve, may be used to advantage. In operation, the door 512 is opened and an external robot blade (not shown) delivers a wafer (not shown) into the chamber cavity 201. The lift pin assembly 232 (shown with the lift pins 234 in a lowered position) is raised to receive the wafer. The lift pins 234 are then lowered to deposit the wafer onto the transfer robot 204 while the external robot blade is retracted and the door 512 is sealed.

In each embodiment disclosed above, a shield, or cover 264 (shown in FIG. 2), may be employed to surround the load lock 200 and define a clean environment 267 about the load lock 200. The cover 264 provides protection from particles which might otherwise migrate into the chamber body 200 and deposit themselves on a wafer. Such particles can lodge within interconnect features of semiconductor wafers resulting in defective devices. A filtration system 268 (shown schematically) operates to maintain the clean environment 267. A loading aperture 266, which is selectively opened and closed by a sealing apparatus (not shown), provides access for an external robot blade (not shown). The external robot blade is preferably located in an adjacent clean room (multiple embodiments of which are described below with respect to FIGS. 12 and 13) adjacent and behind the load lock 200. Other embodiments designed to shield the load lock 200 from contamination are discussed below.

The above described embodiments are designed to overcome the disadvantages and problems of the prior art. By coupling a dedicated load lock to each processing chamber the system as a whole achieves greater independence. Each load lock and matching process chamber may be viewed as a single discrete unit. The functionality of any given unit is self-contained so that the system may continue to operate despite downtime for any particular unit. Thus, maintenance and servicing may be performed on one or more units while others continue to process wafers. While the present invention uses the concept of a vacuum gradient to advantage (e.g., between the load lock and the process chamber), the application of the concept herein favors minimization of such gradients. Rather than adding additional components, the present invention utilizes a vacuum gradient only between the load lock chamber and the process chamber. Further, as described above, the volume of the load lock chamber is minimized so that the pumpdown time may be decreased. The result of greater independence and minimization of vacuum gradients and volume is higher throughput.

Figure 12:
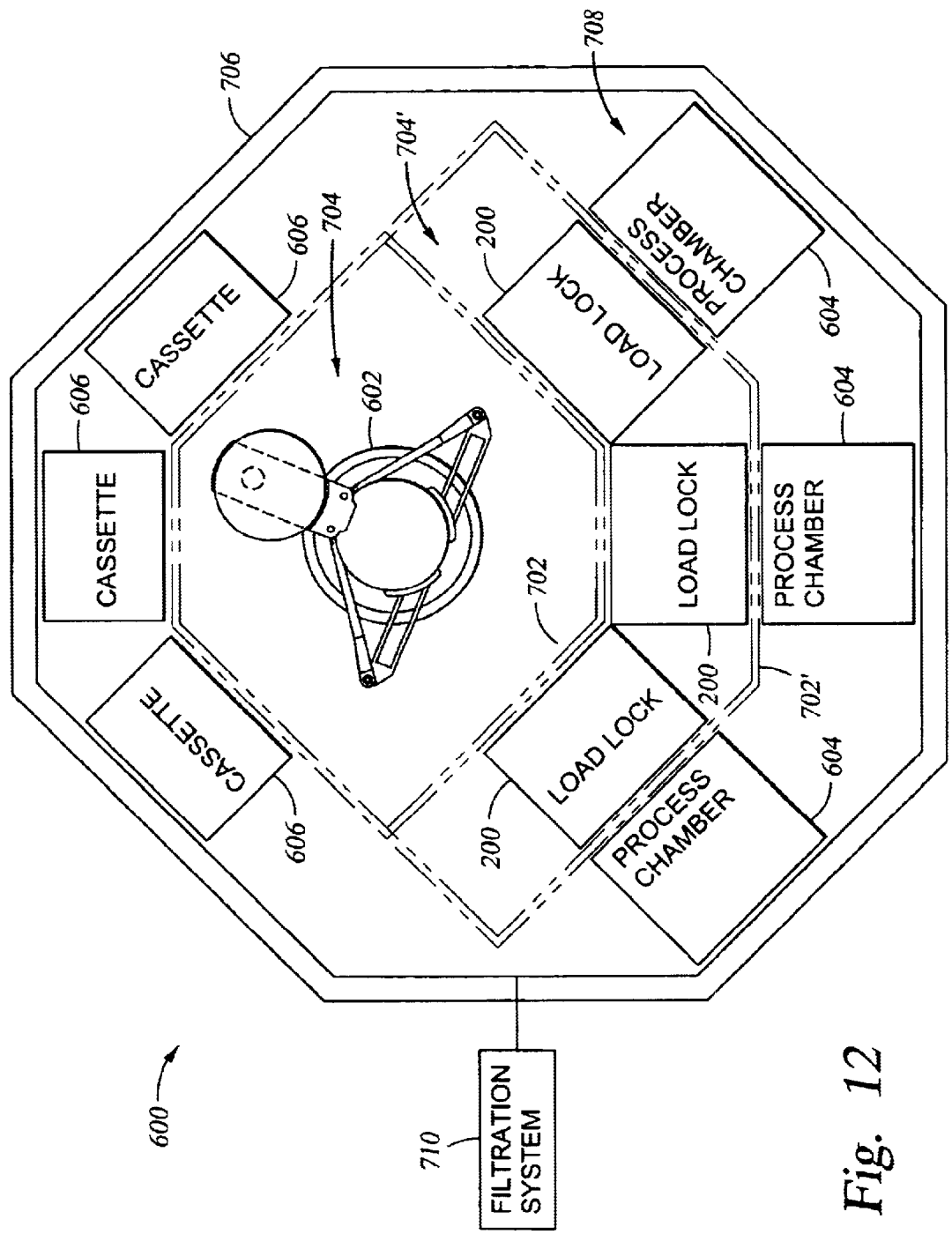
FIG. 12 is a schematic top view of a system configuration.
Figure 13:
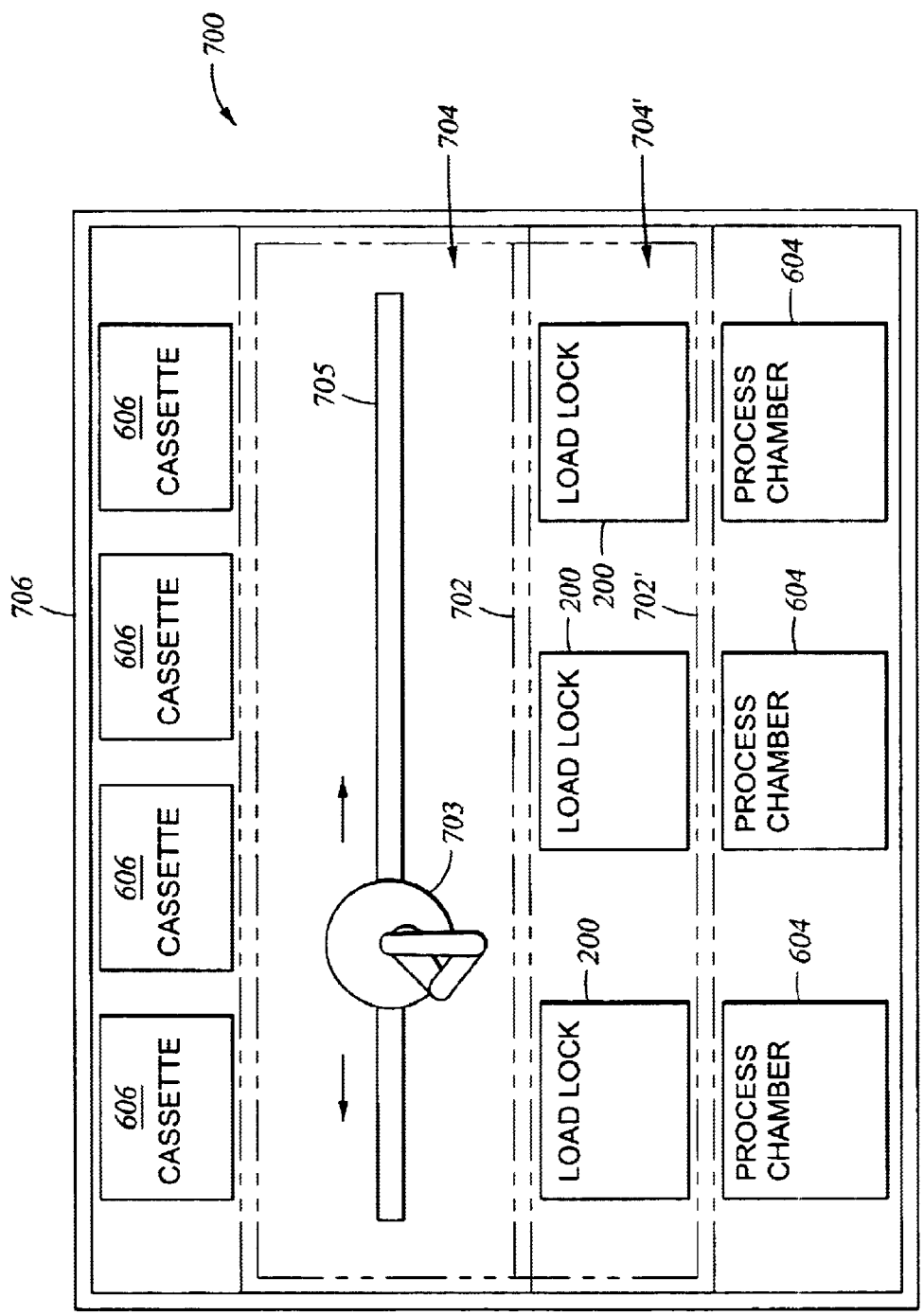
FIG. 13 is a schematic top view of a second system configuration.

In addition, the present invention also provides greater design flexibility. Because the units are comprised only of two components, the process chamber and the load lock, the system design may be manipulated to accommodate various configurations limited by space. FIGS. 12 and 13, described in detail below, show alternative configurations.

FIG. 12 shows a configuration of a semiconductor manufacturing system 600 incorporating the present invention. An atmospheric robot 602 having a single degree of freedom (θ) occupies a central location within the system 600. Each load lock 200 is dedicated to a single process chamber 604 and is located proximate to the atmospheric robot 602. The atmospheric robot 602 accesses wafer cassettes 606 positioned nearby to retrieve a wafer and then rotates to face one of the load locks 200. The wafer is transferred into the load lock 200 and subsequently into the process chamber 604. Once wafer processing is completed, the atmospheric robot 602 retrieves the wafer and returns it to a cassette 606.

FIG. 13 shows another configuration incorporating the present invention wherein a system configuration 700 is linear and an atmospheric robot 703, traveling along a track 705 requires two degrees of freedom, X-θ. The cassettes 606 are located on one side of the track 705 while the load locks 200 and attached process chambers 604 are located on the other side. The atmospheric robot 703 travels along the track 705 and communicates with the cassettes 606 and the load locks 200.

In both FIG. 12 and FIG. 13, the load lock environment may be maintained at atmospheric pressure. Thus, the present invention dispenses with the need for a large constant vacuum system and/or multiple intermediate vacuum stages. Further a mini-environment 704 may be defined by a wall 702. The wall 702 is shown as enclosing the atmospheric robots 602, 703 and having the various components of the systems 600 and 700 attached along an exterior side of the wall 702. FIGS. 12 and 13 show two other configurations in which the wall is moved to encompass additional components. In a preferred embodiment, wall 702' (shown in phantom) includes the load locks 200 within a mini-environment 704' while yet another configuration, shown in FIGS. 12 and 13, encompasses all the components by a wall 706 such that the entire systems 600 and 700 comprise mini-environments 708. The mini-environments 704, 704', 708 maintain a clean room substantially free of contaminants. A filtration system 710 (only one shown servicing mini-environment 708) supplies a filtered inert gas, such as air, into the mini-environment 708 and vents gray air therefrom.

Each wall position described above offers unique advantages. For example walls 702' and 706 eliminate the need for the shield 264 (see FIG. 2) and sealing valve by including the load locks 200 within the clean room.

FIGS. 12 and 13 show a number of possible embodiments; however, a person skilled in the art will appreciate and recognize other configurations and applications to which the present invention can be adapted.

While the foregoing is directed to a preferred embodiment of the invention, other and further embodiments of the invention may be devised without departing from the basic scope thereof, and the scope thereof is determined by the claims which follow.

What is claimed is:

1. A semiconductor processing system comprising:
 a mini-environment defined by a wall and having an atmospheric robot disposed therein;
 a load lock chamber connected to the mini-environment, comprising;
  i) an enclosure having a bottom, a lid, and sidewalls defining a chamber cavity, wherein a central portion of the chamber cavity has a diameter about equal to a diameter of a substrate to be received in the system; and
  ii) a transfer robot disposed in the load lock chamber adjacent the bottom and the lid; and
 a process chamber connected to the load look chamber.

2. The system of claim 1 wherein the load lock chamber further comprises:
 one or more perforations disposed in the bottom thereof; and
 one or more lift pins slidably disposed through the one or more perforations to transfer a wafer between the atmospheric robot and the load lock chamber, wherein the atmospheric robot is configured to transfer a wafer into the load lock chamber, and the transfer robot is configured to transfer the wafer from the load lock chamber into the process chamber.

3. The system of claim 2 wherein the lift pins are coupled at one end to a linear actuator.

4. The system of claim 1 further comprising a vacuum pump connected to the load lock chamber.

5. The system of claim 1 wherein the load lock chamber further comprises an elongated substantially rectangular aperture in the load lock sidewalls for receiving a substrate from the atmospheric robot.

6. The system of claim 5 wherein the load lock chamber further comprises a hermetic sealing apparatus adapted to substantially cover the aperture.

7. The system of claim 6 wherein the hermetic sealing apparatus comprises a slit valve.

8. The system of claim 6 wherein the hermetic sealing apparatus comprises a gate valve.

9. The system of claim 1 wherein the load lock chamber has an aperture in the sidewall leading to the process chamber and further comprises a cover defining an opening, wherein the lid is adapted to substantially cover the opening.

10. The system of claim 9 wherein the lid further comprises at least one stabilizing rod disposed through the lid and connected to the cover.

11. The system of claim 1 wherein the transfer robot comprises:
 a symmetrical linkage assembly, comprising:
  i) a first drive arm having a first end and a second end, the first drive arm being rotatable about a first axis at its first end;
  ii) a second drive arm having a first end and a second end, the second drive arm being rotatable about a second axis at its first end, the first and second drive arms being separated by a distance greater than a substrate diameter in their extended positions such that a substrate may be vertically transferred between the drive arms;
  iii) a first strut that is connected to the first drive arm at a first pivot joint; and
  iv) a second strut that is connected to the second drive arm at a second pivot joint, the first and second pivot joints defining a lagging axis; and
 a blade pivotally connected to the first strut at a first wrist joint and the second strut at a second wrist joint, the first and second wrist joints defining a leading axis which remains constantly parallel to, and horizontally displaced from, the lagging axis.

12. The system of claim 11 wherein the blade is extended by the simultaneous and synchronous clockwise rotation of the first drive arm and counterclockwise rotation of the second drive arm.

13. The system of claim 11 wherein the blade is retracted by the simultaneous and synchronous counterclockwise rotation of the first drive arm and clockwise rotation of the second drive arm.

14. The system of claim 1 wherein the load lock chamber has a volume of about 10 liters to about 12 liters.

15. The system of claim 1 wherein the load look chamber further comprises a substrate lifting means that positions a substrate.

16. The system of claim 1 wherein the load lock is linearly connected to the process chamber.

17. A semiconductor processing system for processing a substrate, comprising:
 a mini-environment defined by a wall and having an atmospheric robot disposed therein;
 a load lock chamber connected to the mini-environment, comprising;

i) an enclosure having a cover defining an opening, a bottom, a lid adapted to substantially cover the opening, and sidewalls defining a chamber cavity, wherein a central portion of the chamber cavity has a diameter about equal to a diameter of a substrate to be received in the system;
ii) at least one stabilizing rod disposed through the lid and connected to the cover by a connecting means;
iii) a transfer robot disposed in the load lock chamber adjacent the bottom and the lid; the transfer robot comprising:
   one or more actuators;
   a substrate support means; and
   a linkage connected between the substrate support means and one or more actuators; and
iv) a vacuum pump in fluid communication with the load lock chamber;
a process chamber connected to the load lock chamber; and
a transfer assembly comprising a plurality of wafer support pins and disposed below the load lock chamber adapted to transfer one or more substrates to a plurality of positions.

18. A semiconductor processing system comprising:
a mini-environment defined by a wall and having an atmospheric robot disposed therein;
a load lock chamber connected to the mini-environment, comprising:
   i) an enclosure having a bottom, a lid, and sidewalls defining a chamber cavity, wherein a central portion of the chamber cavity has a diameter about equal to a diameter of a substrate to be received in the system; and
   ii) a transfer robot disposed in the load lock chamber adjacent the bottom and the lid, the transfer robot comprising:
      a) one or more actuators;
      b) a linkage; and
      c) a supporting means; and
a process chamber connected to the load lock chamber.

* * * * *